(12) United States Patent
Deng et al.

(10) Patent No.: US 12,112,991 B1
(45) Date of Patent: Oct. 8, 2024

(54) SYSTEM ON WAFER ASSEMBLY STRUCTURE AND ASSEMBLY METHOD THEREOF

(71) Applicant: ZHEJIANG LAB, Zhejiang (CN)

(72) Inventors: Qingwen Deng, Hangzhou (CN); Kun Zhang, Hangzhou (CN); Ruyun Zhang, Hangzhou (CN)

(73) Assignee: ZHEJIANG LAB, Hangzhou (CN)

( * ) Notice: Subject to any disclaimer, the term of this patent is extended or adjusted under 35 U.S.C. 154(b) by 0 days.

(21) Appl. No.: 18/497,947

(22) Filed: Oct. 30, 2023

(30) Foreign Application Priority Data

May 10, 2023 (CN) .......................... 202310521113.5

(51) Int. Cl.
*H01L 23/00* (2006.01)
*H01L 21/66* (2006.01)

(52) U.S. Cl.
CPC .............. *H01L 22/34* (2013.01); *H01L 22/22* (2013.01); *H01L 22/32* (2013.01)

(58) Field of Classification Search
CPC .......... H01L 22/30; H01L 22/32; H01L 22/34
See application file for complete search history.

(56) References Cited

U.S. PATENT DOCUMENTS

| | | | | |
|---|---|---|---|---|
| 5,476,211 A * | 12/1995 | Khandros | ............ | H05K 3/3426 |
| | | | | 257/E21.507 |
| 6,278,193 B1 * | 8/2001 | Coico | .................... | H01L 24/81 |
| | | | | 257/E23.179 |
| 8,342,711 B2 * | 1/2013 | Lin | ......................... | F21V 29/70 |
| | | | | 362/249.02 |
| 10,797,681 B1 * | 10/2020 | Hurwitz | ............ | H01L 21/76871 |
| 2003/0099097 A1 * | 5/2003 | Mok | ................... | G01R 1/07342 |
| | | | | 361/767 |

(Continued)

FOREIGN PATENT DOCUMENTS

| | | |
|---|---|---|
| CN | 1662820 A | 8/2005 |
| CN | 101009333 A | 8/2007 |

(Continued)

OTHER PUBLICATIONS

First Office Action(CN202310521113.5); Date of Mailing: Jun. 16, 2023.

(Continued)

*Primary Examiner* — Mounir S Amer
*Assistant Examiner* — Alexander Belousov
(74) *Attorney, Agent, or Firm* — W&G Law Group (57) ABSTRACT

A system on wafer assembly structure and an assembly method thereof. The system on wafer assembly structure comprises: a wafer layer, a dielectric layer and a circuit board layer sequentially stacked, and each provided with a bonding region, a testing region and an alignment region, respectively, a first assembly, and a second assembly, wherein the first assembly is arranged on one side of the wafer layer far away from the dielectric layer, and comprises a bearing portion and at least one latch portion connected with each other, and the bearing portion is detachably connected with the wafer layer. The second assembly is at least partially arranged around the first assembly. The second assembly has a hole portion for accommodating a latch portion, and the inner diameter of the hole portion is larger than the outer diameter of the latch portion.

6 Claims, 6 Drawing Sheets

(56) References Cited

U.S. PATENT DOCUMENTS

| | | | |
|---|---|---|---|
| 2005/0017348 A1* | 1/2005 | Haba .................. | B81B 7/007 |
| | | | 438/106 |
| 2007/0085099 A1* | 4/2007 | Fukumitsu .......... | B28D 5/0011 |
| | | | 257/98 |
| 2007/0170506 A1* | 7/2007 | Onogi ............... | H01L 29/78609 |
| | | | 257/E27.111 |
| 2010/0315815 A1* | 12/2010 | Lin .................. | F21V 29/70 |
| | | | 362/249.01 |
| 2017/0098769 A1* | 4/2017 | Im .................. | H10K 71/70 |
| 2019/0278398 A1* | 9/2019 | Kim .................. | G06F 3/04164 |
| 2021/0181889 A1* | 6/2021 | Kim .................. | G06F 3/0416 |
| 2022/0013620 A1* | 1/2022 | Kim .................. | H05K 1/189 |

FOREIGN PATENT DOCUMENTS

| | | |
|---|---|---|
| CN | 111130483 A | 5/2020 |
| CN | 114759012 A | 7/2022 |
| CN | 115003025 A | 9/2022 |
| JP | 2000354949 A | 12/2000 |
| TW | M292818 U | 6/2006 |
| TW | 201100700 A | 1/2011 |

OTHER PUBLICATIONS

Notice Of Allowance(CN202310521113.5); Date of Mailing: Jun. 30, 2023.

\* cited by examiner

SYSTEM ON WAFER ASSEMBLY STRUCTURE AND ASSEMBLY METHOD THEREOF

CROSS-REFERENCE TO RELATED APPLICATIONS

The present application claims priority to Chinese Patent Application No. 202310521113.5, filed on May 10, 2023, the content of which is incorporated herein by reference in its entirety.

TECHNICAL FIELD

The present disclosure relates to the technical field of integrated circuits, and in particular, to a system on wafer assembly structure and an assembly method thereof.

BACKGROUND

In the field of semiconductor manufacturing, there is a famous Moore's law: the number of transistors that can be accommodated in an integrated circuit will double in about 18 months. The semiconductor industry has developed for more than half a century according to Moore's Law, which has contributed to the world economic growth in the second half of the 20th century, and has driven a series of scientific and technological innovations, social reforms, the improvement of production efficiency and economic growth. The improvement and innovation of personal computer, Internet, smart phone and other technologies are inseparable from the continuation of Moore's Law. However, in recent years, with the line width of micro-nano processing reaching 2 nm or even smaller, the Moore's law has gradually failed, and the improvement of the computing performance has slowed down obviously, while the data volume of the Internet of Everything has exploded exponentially, and the "scissors gap" between data scale and computing power has become wider and wider. Integrated circuits are welcoming a period of major technological and industrial changes in the "post-Moore era".

Software Defined System on Wafer (SOW) was put forward to solve the unsustainable problem of Moore's Law. The substrate used in SOW is a whole portion semiconductor wafer, such as a 2-inch to 12-inch silicon wafer, which is not diced, and is wired by a Re-distributed layer RDL process. Active devices, such as switches, operational amplifiers, Analog-to-digital converter ADC, logic unit circuits, are fabricated by semiconductor technology according to system functions, or devices can be not fabricated according to system application requirements, only RDL wiring is used. The whole portion wafer is used to replace the traditional substrate, and all functional circuits and active units are integrated on the wafer. SOW runs through the whole portion process of designing, processing and packaging of the integrated circuit, and integrates advanced concepts such as preform assembly and wafer integration. With the significant advantages of wafer-level interconnection such as high bandwidth, low delay and low power consumption, thousands of "preform" particles such as sensing, RF, computing, storage and communication can be integrated on a single wafer. By breaking the boundary conditions such as design methods, realization materials and integration methods of existing integrated circuits, the performance limit of current chips can be effectively cracked, and the "ceiling effect" faced by key information infrastructures that rely on "stacked" engineering technology routes can be broken, and the technical and physical forms of traditional equipment or systems can be refreshed, so that the comprehensive technical indicators of the system can gain multiplicative gains and meet the sustainable development needs of new-generation infrastructures such as 5G, big data, cloud platform, AI, edge computing and smart network in the intelligent era.

SOW, as a cutting-edge technology, is not perfect in core-particle interface standard, substrate design specification, prefabrication mounting specification, yield testing standard, system assembly method and testing specification. Especially in the assembly and inspection of the system, there is no good technical means. At present, the traditional stacked assembly method is prone to problems such as poor contact, dislocation of pads and interlayer creep. Therefore, a new system on wafer assembly structure and method are urgently needed to solve the above problems.

SUMMARY

In view of the shortcomings of the related art, the present disclosure provides a system on wafer assembly structure and an assembly method thereof, which are used for solving the problem of low yield caused by poor contact of the system on wafer assembly structure, dislocation of bonding pads or interlayer creep in the related art.

The present disclosure provides a system on wafer assembly structure, which includes a wafer layer, a dielectric layer and a circuit board layer sequentially stacked, and each provided with a bonding region, a testing region and an alignment region, respectively. The system on wafer assembly structure further includes a first assembly and a second assembly. The first assembly is arranged on one side of the wafer layer far away from the dielectric layer, the first assembly comprises a bearing portion and at least one latch portion connected with each other, and the bearing portion is detachably connected with the wafer layer; and the second assembly is at least partially arranged around the first assembly; and the second assembly has a hole portion for accommodating the latch portion, an inner diameter of the hole portion is larger than an outer diameter of the latch portion, there is a gap between one side of the second assembly close to the bearing portion and the bearing portion, and the second assembly is detachably connected with the dielectric layer and the circuit board layer, respectively.

According to the above-mentioned embodiments, a novel system on wafer assembly structure is designed in the present disclosure. The system on wafer includes a wafer layer, a dielectric layer, a circuit board layer, and a first assembly and a second assembly nested and matched with each other. The first assembly is detachably connected with the wafer layer, and the first assembly can move in any direction within a preset range under the restriction of the second assembly; and the second assembly is detachably connected with the dielectric layer and the circuit board layer, respectively. Therefore, the wafer layer can be fixed on the first assembly, then the dielectric layer is connected with the second assembly, and the wafer layer can be moved by moving the first assembly to align the wafer layer and the dielectric layer. After the alignment, the electrical conduction test can be carried out, and the relative position between the wafer layer and the dielectric layer can be kept unchanged after the test is completed; and the alignment between the circuit board layer and the dielectric layer can further be realized. Therefore, through the system on wafer assembly structure provided by the present disclosure, the system on wafer can be assembled and accurately aligned through simple operation combined with the electrical conduction test, and the problems of poor contact, dislocation of bonding pads and interlayer creep can be avoided.

In addition, the alignment adjustment is realized between the first assembly and the second assembly through the cooperation of the latch portion and the hole portion, so that the structure is simple, the assembly and fixation are convenient, and the assembly efficiency is improved.

In an embodiment, the system on wafer assembly structure further includes a movable assembly. The movable assembly is arranged on one side of the first assembly far away from the wafer layer, and is detachably connected with the first assembly for adjusting the orientation of the wafer layer during alignment.

In an embodiment, the movable assembly includes a vacuum adsorption structure; a gas channel is arranged in the vacuum adsorption structure, and a port at one end of the gas channel faces one side of the first assembly far away from the wafer layer for contacting with the first assembly; and the other end of the gas channel is connected with an air pump, and the air pump is configured to control an air pressure in the gas channel so as to allow the movable assembly and the first assembly be connected or disconnected by adsorption with each other.

In an embodiment, the movable assembly includes a magnetic attraction structure; the first assembly is made of a magnetic material; and a magnetic attraction force of the magnetic attraction structure is adjustable to allow the movable assembly and the first assembly connected or disconnected by adsorption with each other.

In an embodiment, the latch portion includes a first latch portion and a second latch portion, and the hole portion includes a first hole portion matched with the first latch portion and a second hole portion matched with the second latch portion.

In an embodiment, the first latch portion and the second latch portion are arranged at opposite sides of the bearing portion, respectively.

In an embodiment, the first latch portion and the second latch portion are arranged at adjacent sides of the bearing portion, respectively.

In an embodiment, a wafer micro bump array, at least two interconnected wafer test pads and at least one first alignment pad are formed on a side of the wafer layer close to the dielectric layer, and a bonding region, a testing region and an alignment region are formed in regions where the pads are located, respectively.

In an embodiment, the dielectric layer is formed with at least one first alignment hole and at least two conductive members penetrating through a surface of the dielectric layer, and the first alignment hole corresponds to the first alignment pad and is configured for preliminary alignment between the wafer layer and the dielectric layer; the conductive members corresponding to the interconnected wafer test pads, respectively, are configured for an electrical conduction test after the preliminary alignment between the wafer layer and the dielectric layer to test an alignment state; the dielectric layer further comprises a plurality of contacts penetrating through the surface of the dielectric layer, the wafer micro bump array is arranged opposite to one side of the contact close to the wafer layer; and at least one second alignment pad is formed on the other side of the dielectric layer far away from the wafer layer.

In an embodiment, at least one second alignment hole is formed in the circuit board layer, and the second alignment hole corresponds to the second alignment pad and is configured for the preliminary alignment between the dielectric layer and the circuit board layer; the circuit board layer is formed with at least two pairs of circuit board conduction pads and circuit board test pads which are electrically connected with each other, and the circuit board conduction pads and the circuit board test pads are arranged on one side of the circuit board layer close to the dielectric layer and the other side of the circuit board layer far away from the dielectric layer, respectively, and the circuit board test pads corresponds to the conductive members, respectively, and are configured for the electrical conduction test after the preliminary alignment between the dielectric layer and the circuit board layer to test the alignment state; and a circuit board micro bump array is formed on one the side of the circuit board layer close to the dielectric layer and arranged opposite to the contacts.

In an embodiment, distances between the conductive members corresponding to the wafer test pads are equal to distances between the wafer test pads corresponding to the conductive members and distances between the circuit board conduction pads corresponding to the conductive members, respectively.

The present disclosure further provides an assembly method of a system on wafer assembly structure. Based on the system on wafer assembly structure provided in the previous embodiment, the method includes the following steps:

Providing assemblies comprising a first assembly and a second assembly, the second assembly is at least partially arranged around the first assembly, and a latch portion of the first assembly is located in a hole portion of the second assembly.

Fixing a wafer layer on the first assembly;

Fixing a dielectric layer on one side of the wafer layer far from the first assembly.

Moving the first assembly, and simultaneously driving the wafer layer to move to a position corresponding to the dielectric layer for preliminary alignment connection.

Performing an electrical conduction test on an alignment state between the dielectric layer and the wafer layer, and fixing a relative position between the wafer layer and the dielectric layer after the electrical conduction test.

Placing a circuit board layer on one side of the dielectric layer far away from the wafer layer, and moving the circuit board layer to a position corresponding to the dielectric layer for preliminary alignment connection.

Performing an electrical conduction test on an alignment state between the circuit board layer and the dielectric layer, and fixing a relative position between the circuit board layer and the dielectric layer after the electrical conduction test.

Fixing a relative position between the first assembly and the second assembly.

According to the above embodiments, the assembly method of the system on wafer assembly structure provided by the present disclosure, combined with the preliminary alignment operation and the electrical conduction test alignment approval operation, can further improve the alignment accuracy of the system on wafer, and at the same time avoid poor contact, so as to further improve the product yield.

In an embodiment, the step of moving the first assembly, and simultaneously driving the wafer layer to move to a position corresponding to the dielectric layer for preliminary alignment connection includes: establishing a detachable connection between a movable assembly and one side of the first assembly far away from the wafer layer; and controlling the movable assembly to move in any direction within a preset range, and driving the wafer layer to move a first alignment pad on the wafer layer to a position corresponding to a first alignment hole on the dielectric layer for preliminary alignment connection.

In an embodiment, the step of fixing a relative position between the first assembly and the second assembly includes: filling the hole portion with an injection molding material to fixedly connect the first assembly and the second assembly.

In an embodiment, the step of performing an electrical conduction test on the alignment state between the circuit board layer and the dielectric layer, and fixing a relative position between the circuit board layer and the dielectric layer after the electrical conduction test includes: testing a conduction state between conductive members on the dielectric layer by a circuit test device, and when the conduction state is conducted, keeping an orientation of the first assembly unchanged and fixing the relative position between the wafer layer and the dielectric layer; when the conduction state is not conducted, moving the first assembly again for preliminary alignment until the conduction state is conducted.

In an embodiment, the step of performing an electrical conduction test on the alignment state between the circuit board layer and the dielectric layer, and fixing a relative position between the circuit board layer and the dielectric layer after the electrical conduction test comprises: testing the conduction state between circuit board test pads by the circuit testing device, and when the conduction state is conducted, keeping an orientation of the circuit board layer unchanged and fixing the relative position between the circuit board layer and the dielectric layer; when the conduction state is not conducted, move the circuit board layer again for preliminary alignment until the conduction state is conducted.

Additional aspect and advantages of that present disclosure will be set forth in part in the description which follow, and will be obvious from the description which follows, or may be learned by practice of the present disclosure.

BRIEF DESCRIPTION OF DRAWINGS

The accompanying drawings, which are incorporated in and constitute a part of this specification, illustrate embodiments consistent with the present disclosure and together with the description, serve to explain the principles of the present disclosure.

Reference signs: 100-Wafer layer; 110-Wafer micro bump array; 120-Wafer test pad; 130-First alignment pad; 101-Wafer notch; 200-Dielectric layer; 201-First alignment hole; 202-First mounting hole; 210-Conductive member; 220-Contact; 230-Second alignment pad; 300-Circuit board layer; 301-Second alignment hole; 302-Second mounting hole; 303-Third alignment hole; 304-Third mounting hole; 310-Circuit board conduction pad; 320-Circuit board test pad; 330-Circuit board micro bump array; 400-First assembly; 410-Bearing portion; 420-Latch portion; 421-First latch portion; 422-Second latch portion; 500-Second assembly; 501-Hole portion; 5011-First hole portion; 5012-Second hole portion; 600-Movable assembly; 610-Gas channel; 620-Air pump; 700-Base; 800-Adjustable fastener.

DESCRIPTION OF EMBODIMENTS

Reference will now be made in detail to exemplary embodiments, examples of which are illustrated in the accompanying drawings. When the following description refers to the drawings, unless otherwise indicated, the same numbers in different drawings indicate the same or similar elements. The embodiments described in the following exemplary embodiments do not represent all embodiments consistent with the present disclosure. Rather, they are merely examples of devices and methods consistent with some aspects of the present disclosure as detailed in the appended claims.

The terminology used in the present disclosure is for the purpose of describing specific embodiments only and is not intended to limit the present disclosure. The singular forms "a", "the" and "said" used in the present disclosure and the appended claims are further intended to include the plural forms, unless the context clearly indicates other meaning. It should further be understood that the term "and/or" as used herein refers to and includes any or all possible combinations of one or more associated listed items.

It is found that the software defined system on wafer upgrades the technical route of integrated circuits from depending on process progress to multi-dimensional collaborative technical route of structure, process and integration, and makes subversive innovations in the design method, calculation paradigm, integration mode and assembly process of integrated circuits, which can drive integrated circuits to leap from the era of system on chip (SOC) to the new era of system on wafer (SOW). As a cutting-edge technology, SOW is not perfect in core-particle interface standard, substrate design specification, preform mounting specification, yield testing standard, system assembly method and testing specification. Especially in the assembly and inspection of the system, there is no good technical means. At present, the traditional stacked assembly method is prone to problems such as poor contact, dislocation of pads and interlayer creep.

The present disclosure provides a system on wafer assembly structure and an assembly method thereof, aiming at solving the above technical problems of related technologies.

Next, the system on wafer assembly structure and assembly method in the embodiment of the present disclosure will be described in detail with reference to the attached drawings. In case of no conflict, the features in the following embodiments can complement each other or be combined with each other.

Figure 1:
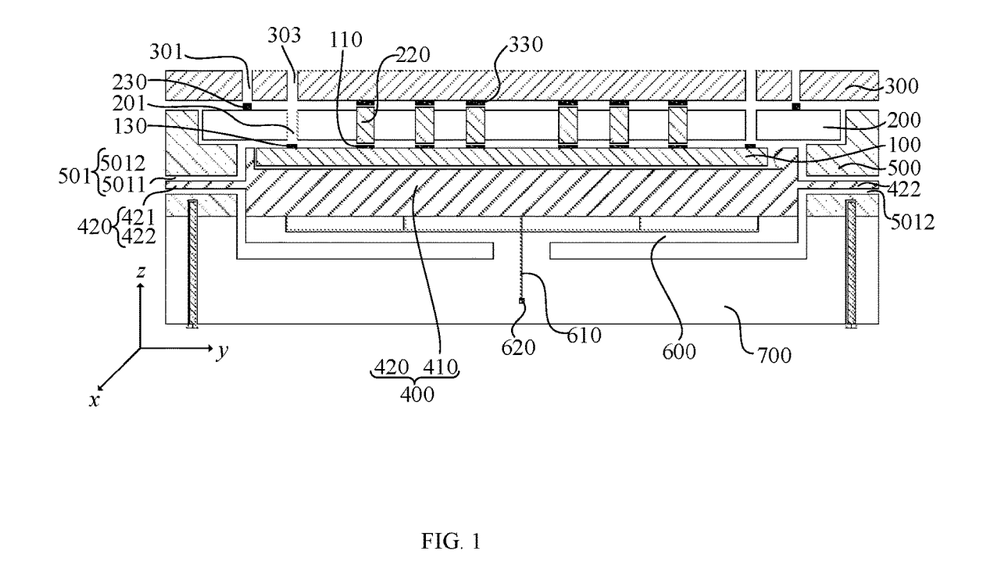
FIG. 1 is a schematic sectional view of the system on wafer assembly structure provided by the present disclosure.

The present disclosure provides a system on wafer assembly structure and an assembly method thereof. As shown in FIG. 1, the system on wafer assembly structure includes a wafer layer 100, a dielectric layer 200 and a circuit board layer 300 sequentially stacked, and each layer is provided with a bonding region a testing region and an alignment region, respectively. The system on wafer assembly structure further includes a first assembly 400 and a second assembly 500. The first assembly 400 is arranged on one side of the wafer layer 100 far away from the dielectric layer 200. The first assembly 400 includes a bearing portion 410 and at least one latch portion 420 which are connected with each other, and the bearing portion 410 is detachably connected with the wafer layer 100. The second assembly 500 is at least partially arranged around the first assembly 400. The second assembly 500 has a hole portion 501 for accommodating the latch portion 420. The inner diameter of the hole portion 501 is larger than the outer diameter of the latch portion 420. There is a gap between one side of the second assembly 500 near the bearing portion 410 and the bearing portion 410. The second assembly 500 is detachably connected with the dielectric layer 200 and the circuit board layer 300, respectively.

According to the above-mentioned embodiments, the present disclosure has designed a novel system on wafer assembly structure, which includes a wafer layer 100, a dielectric layer 200, a circuit board layer 300 and a first assembly 400 and a second assembly 500 which are nested and matched with each other. The first assembly 400 is detachably connected with the wafer layer 100, and the first assembly 400 can move in any direction within a preset range under the restriction of the second assembly 500; the second assembly 500 is detachably connected with the dielectric layer 200 and the circuit board layer 300, respectively. Therefore, the wafer layer 100 can be firstly fixed on the first assembly 400, then the dielectric layer 200 is connected with the second assembly 500, and the wafer layer 100 can be driven by moving the first assembly 400 to conduct alignment between the wafer layer 100 and the dielectric layer 200. After the alignment, the electrical conduction test can be conducted, and the relative position between the wafer layer 100 and the dielectric layer 200 can be kept unchanged after the electrical conduction test. Similarly, the alignment between the circuit board layer 300 and the dielectric layer 200 can further be realized. Therefore, through the system on wafer assembly structure provided by the present disclosure, the system on wafer can be assembled and accurately aligned through simple operation combined with the electrical conduction test, and the problems of poor contact, dislocation of bonding pads and interlayer creep can be avoided.

Figure 9:
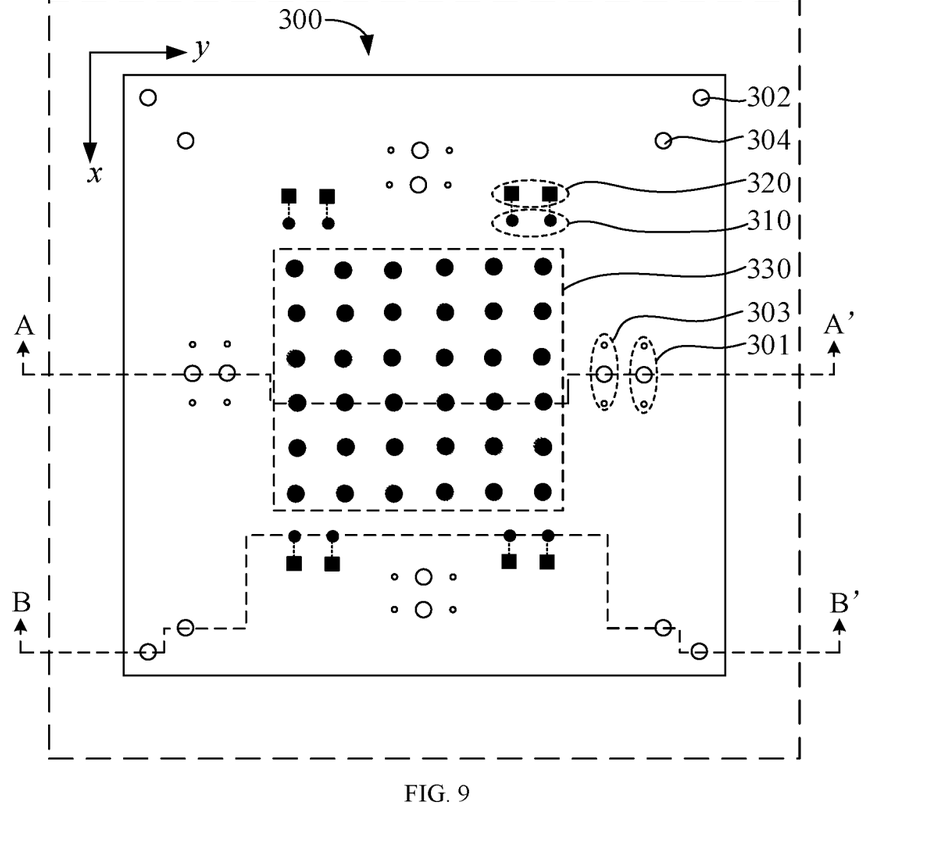
FIG. 9 is a top view of a circuit board layer provided by the present disclosure.

In addition, the alignment adjustment between the first assembly 400 and the second assembly 500 is realized through the cooperation of the latch portion 420 and the hole portion 501, which is simple in structure, convenient to assemble and fix, and beneficial to improve the assembly efficiency. It should be noted that FIG. 1 is a cross-sectional view of the system on wafer assembly structure provided by this embodiment along the dashed line AA' as shown in FIG. 9.

In some embodiments, the material of the dielectric layer 200 is an organic low-loss material. The wafer layer 100 and the circuit board layer 300 can be attached and fixed more tightly through the intermediate dielectric layer 200 to avoid poor contact.

In some embodiments, the material of the circuit board layer 300 is FR-4, an aluminum substrate or a thermoelectric separation copper substrate. It should be noted that the circuit board layer 300 can be made of conventional materials in the field, which is not limited in the present disclosure.

In some embodiments, the first assembly 400 and the second assembly 500 are made of metal.

In an illustrative embodiment, the materials of the first assembly 400 and the second assembly 500 are both red copper.

Figure 6:
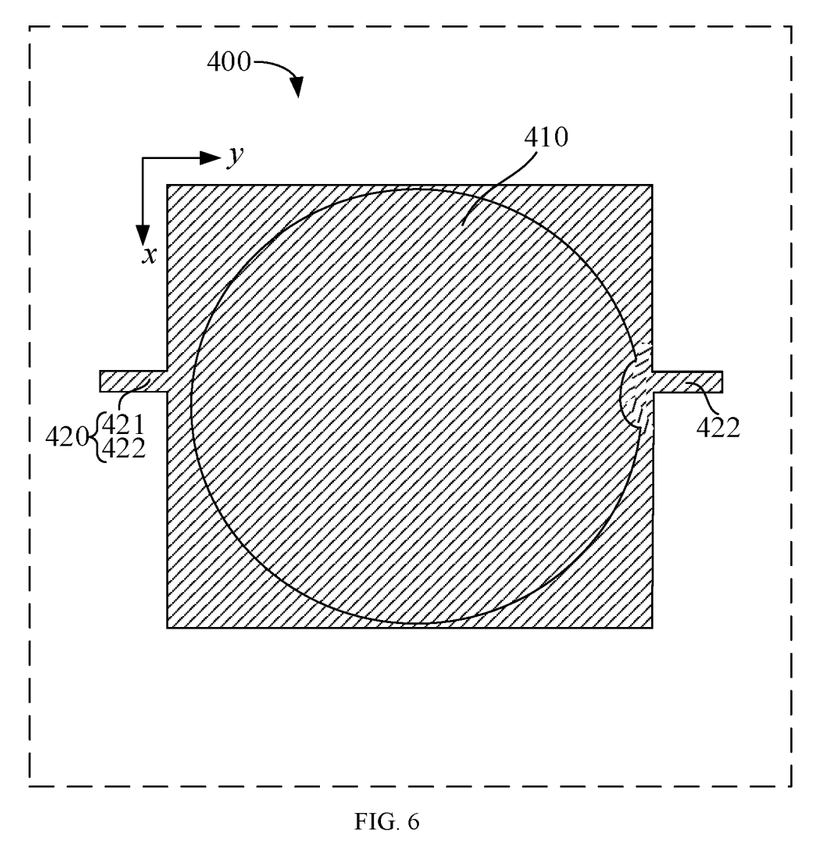
FIG. 6 is a top view of a first assembly provided by the present disclosure.

In some embodiments, as shown in FIGS. 1 and 6, one side of the bearing portion 410 near the wafer layer 100 is provided with a recessed region for accommodating the wafer layer 100, which is adapted to the shape of the wafer layer 100 to fix the position of the wafer layer 100 relative to the first assembly. It should be noted that the concave region of the bearing portion 410 is provided with a protrusion, which is adapted to the notch of the wafer layer 100 to avoid the rotation of the wafer layer 100.

In some embodiments, the latch portion 420 can be rectangular, circular, elliptical, triangular or polygonal, and the hole portion 501 matched with the latch portion 420 has the same shape as the latch portion 420.

In an illustrative embodiment, the latch portion 420 is square, and the hole portion 501 matched with the latch portion 420 is further square.

In some embodiments, as shown in FIG. 1, the inner diameter of the hole portion 501 is larger than the outer diameter of the latch portion 420, and the difference between the inner diameter of the hole portion 501 and the outer diameter of the latch portion 420 is 2-20 mm, so that the latch portion 420 of the first assembly 400 can move in any direction within the plane formed in the hole portion 501 of the second assembly 500 along the x direction and the z direction.

In an illustrative embodiment, the difference between the outer diameter of the latch portion 420 and the inner diameter of the hole portion 501 is 6 mm.

In some embodiments, as shown in FIG. 1, the gap between one side of the second assembly 500 near the bearing portion 410 and the bearing portion 410 is 1-10 mm, so that the latch portion 420 of the first assembly 400 can move in the positive or negative direction of the y direction in the hole portion 501 of the second assembly 500.

In an illustrative embodiment, the gap between one side of the second assembly 500 near the bearing portion 410 and the bearing portion 410 is 3 mm.

In some embodiments, as shown in FIGS. 3-6, the bearing portion 410 of the first assembly 400 is square, and the second assembly is square and annular and is arranged around the first assembly 400. The outer wall of the bearing portion 410 of the first assembly 400 is connected with the latch portion 420, and the inner wall of the second assembly 500 close to the first assembly 400 is provided with a recessed hole portion 501, so that the first assembly 400 can move in any direction within a preset range under the restriction of the second assembly 500.

Figure 4:
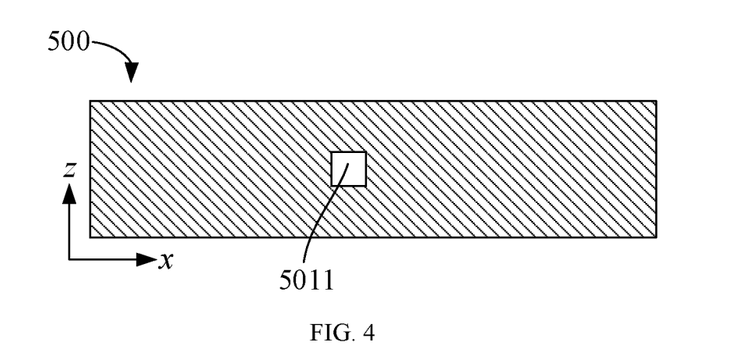
FIG. 4 is one side view of the second assembly in FIG. 3.
Figure 5:
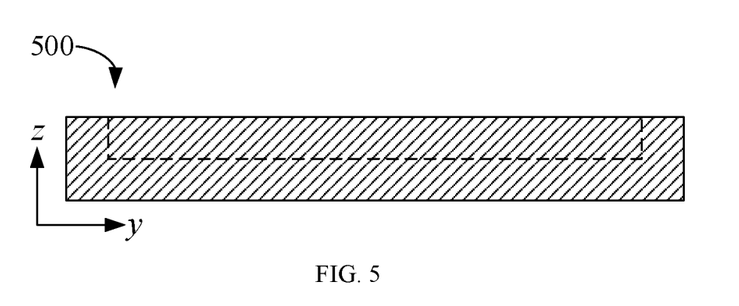
FIG. 5 shows another side view of the second assembly in FIG. 3.

In some embodiments, as shown in FIG. 4, the hole portion 501 is a through hole portion, so as to facilitate injection of injection molding material after the alignment is completed to fix the relative positions of the first assembly 400 and the second assembly 500.

In some embodiments, the system on wafer assembly structure further includes a movable assembly 600. The movable assembly 600 is arranged on one side of the first assembly 400 far away from the wafer layer 100, and the movable assembly 600 is detachably connected with the first assembly 400 for adjusting the orientation of the wafer layer 100 during alignment.

In this embodiment, the movable assembly 600 is added to one side of the first assembly 400 far away from the wafer layer 100, which can replace the traditional manual movement mode, fix the first assembly 400 with mechanical movable assembly, and adjust the orientation of the first assembly 400 to drive the wafer layer 100 to move, thus realizing the alignment connection between the wafer layer 100 and the dielectric layer 200. Efficient and accurate alignment can be further realized to avoid individual error and manual error of manual operation.

In some embodiments, the movable assembly 600 is connected with a control device, and the control device is provided with a control structure for controlling the movable assembly 600 to move freely in the x, y and z directions. In an illustrative embodiment, the control device is provided with an x knob, a y knob and a z knob, which are configured for controlling the movement in the x, y and z directions, respectively.

In some embodiments, the movable assembly 600 is arranged on one side of the circuit board layer 300 far away from the first assembly 400, and the movable assembly 600 is detachably connected with the circuit board layer 300. The movable assembly 600 in this embodiment can be configured to adjust the orientation of the circuit board layer 300 after fixing the position of the dielectric layer 200 to achieve accurate alignment. Those skilled in the art can make flexible adjustments, which are not limited to this.

In some embodiments, the movable assembly 600 includes a vacuum adsorption structure; a gas channel 610 is arranged in the vacuum adsorption structure, and the port at one end of the gas channel 610 faces one side of the first assembly 400 far away from the wafer layer 100 for contacting with the first assembly 400; the other end of the gas channel 610 is connected with an air pump 620, and the air pump 620 is configured for controlling the air pressure in the gas channel 610 so as to make the movable assembly 600 and the first assembly 400 be connected or disconnected by adsorption.

In this embodiment, the movable assembly 600 can simply and quickly establish an adsorption connection with the first assembly 400 by adopting a vacuum adsorption structure. By controlling the movement of the first assembly 400, the wafer layer 100 is moved to a target position for alignment connection. After testing that the alignment connection between the wafer layer 100 and the dielectric layer 200 is accurate, the relative position between the first assembly 400 and the second assembly 500 can be fixed, and then the adsorption connection can be released. The movable assembly 600 can be recycled in mass production.

In some embodiments, the gas pipeline includes several pipeline branches, which are evenly distributed on one side of the movable assembly 600 near the first assembly 400.

In an illustrative embodiment, the number of pipeline branches is 5.

In some embodiments, the movable assembly 600 includes a magnetic attraction structure; the first assembly 400 is a magnetic material; the magnetic attraction force of the magnetic attraction structure is adjustable to connect or disconnect the movable assembly 600 and the first assembly 400.

In this embodiment, the movable assembly 600 and the first assembly 400 are connected by magnetic attraction. After testing that the alignment connection between the wafer layer 100 and the dielectric layer 200 is accurate, the relative position between the first assembly 400 and the second assembly 500 can be fixed, and then the magnetic connection can be eliminated. The magnetic attraction structure in this embodiment can more safely establish the detachable connection relationship between the movable assembly 600 and the first assembly 400, avoid the risk of unstable connection between the movable assembly 600 and the first assembly 400 due to uneven contact surface, and ensure that the movable assembly 600 can accurately realize the alignment between the wafer layer 100 and the dielectric layer 200.

In some embodiments, several turns of magnetic coils are evenly distributed on one side of the magnetic attraction structure near the first assembly 400, so as to realize uniform adsorption connection.

In some embodiments, the latch portion 420 includes a first latch portion 421 and a second latch portion 422, and the hole portion 501 includes a first hole portion 5011 and a second hole portion 5012 that are matched with the first latch portion 421 and the second latch portion 422. The first latch portion 421 and the second latch portion 422 are disposed at opposite sides of the bearing portion 410, respectively.

In an illustrative embodiment, as shown in FIGS. 1 and 6, in this embodiment, the first latch portion 421 and the second latch portion 422 are arranged on the left and right sides of the bearing portion 410 of the first assembly 400, respectively. When fixing the relative position between the first assembly 400 and the second assembly 500, the orientation between them can be relatively fixed by connecting the latch portion 420 of the first assembly 400 and the hole portion 501 of the second assembly 500. The position between the two sides is relatively located on the same axis, which can improve the stability of their fixed connection.

In some embodiments, the first latch portion 421 and the second latch portion 422 are disposed at adjacent sides of the bearing portion 410, respectively.

In an illustrative embodiment, latch portions 420 are provided around the bearing portion 410 of the first assembly 400 to correspond to the hole portions 501 between the second assemblies 500 one by one, respectively, so that a relatively more stable and fixed connection between the first assembly 400 and the second assembly 500 can be realized.

Figure 7:
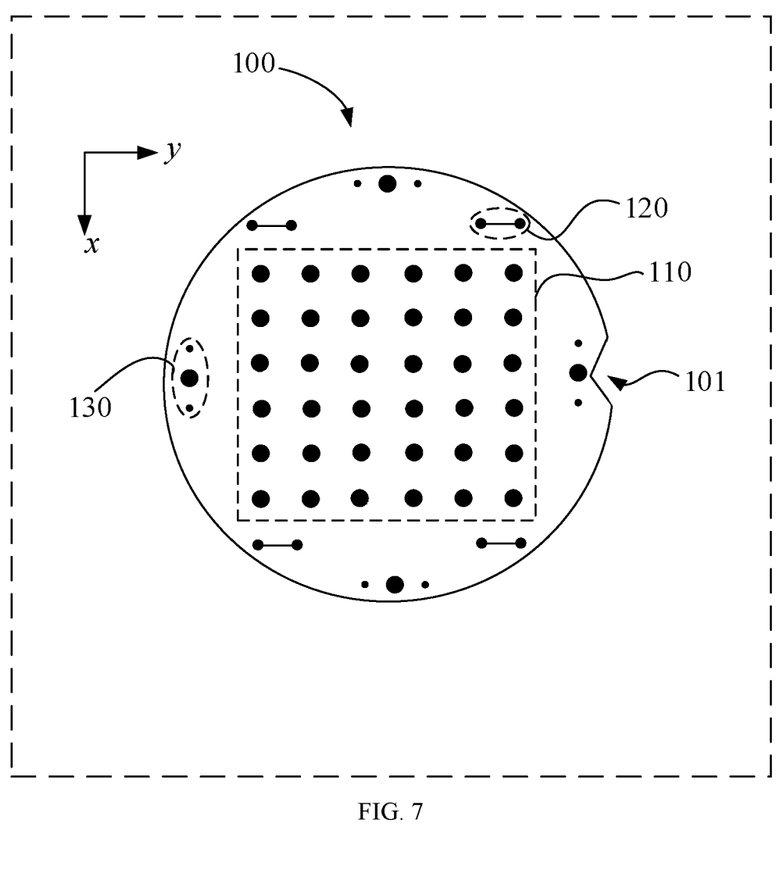
FIG. 7 is a top view of a wafer layer provided by the present disclosure.
Figure 8:
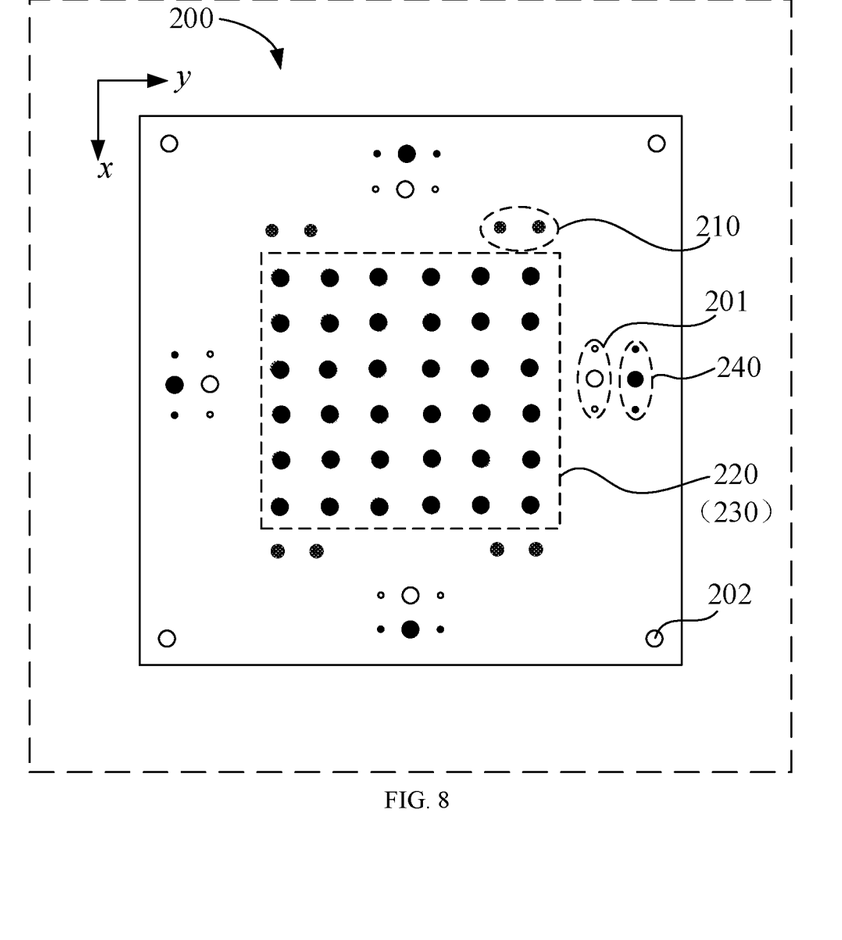
FIG. 8 is a top view of a dielectric layer provided by the present disclosure.

In some embodiments, as shown in FIGS. 7-9, a wafer micro bump array 110, at least two interconnected wafer test pads 120 and at least one first alignment pad 130 are formed on one side of the wafer layer 100 near the dielectric layer 200, and the regions where the pads are located form the bonding region, the testing region and the alignment region, respectively.

In some embodiments, as shown in FIGS. 7 to 9, the dielectric layer 200 is formed with at least one first alignment hole 201 and at least two conductive members 210 penetrating through the surface of the dielectric layer 200. The first alignment hole 201 corresponds to the first alignment pad 130 and is configured for the initial alignment between the wafer layer 100 and the dielectric layer 200. The conductive members 210 correspond to the interconnected wafer test pads 120, respectively, and are configured for the electrical conduction test after initial alignment to test the alignment state; and the dielectric layer 200 further includes a plurality of contacts 220 penetrating through the surface of the dielectric layer, and one side of the contacts 220 close to the wafer layer 100 is arranged opposite to the wafer micro bump array 110; at least one second alignment pad 230 is formed on one side of the dielectric layer 200 far from the wafer layer 100.

In some embodiments, as shown in FIGS. 7 to 9, the circuit board layer 300 is formed with at least one second alignment hole 301, which corresponds to the second alignment pad 230 and is configured for preliminary alignment between the dielectric layer 200 and the circuit board layer 300; the circuit board layer 300 is formed with at least two pairs of circuit board conduction pads 310 and circuit board test pads 320 which are electrically connected with each other, and the circuit board conduction pads 310 and the circuit board test pads 320 are arranged on one side of the circuit board layer 300 close to the dielectric layer 200 and on one side of the circuit board layer 300 far from the dielectric layer 200, respectively; and the circuit board test pads 320 correspond to the conductive members 210, respectively, and are configured for the electrical conduction test after preliminary alignment between the dielectric layer and the circuit board layer to test the alignment state; and a circuit board micro bump array 330 is formed on the side of the circuit board layer 300 near the dielectric layer 200, and the circuit board micro bump array 330 is arranged opposite to the contact 220.

In the above embodiments, the wafer layer 100, the dielectric layer 200 and the circuit board layer 300 are provided with micro bump structures for alignment testing and connection, respectively, and the alignment can be assisted by a stereomicroscope, a magnifying glass and the like, and the electrical conduction test can be performed by a circuit testing device. Bonding connection can be realized by the micro bump electrical array, so as to improve the alignment accuracy and meet the assembly requirements.

It should be noted that the number and size of the alignment holes and the alignment micro bumps are not specifically limited in this embodiment. In the present disclosure, a series of alignment holes with different sizes and numbers and the corresponding alignment micro bumps can be designed to improve the alignment accuracy and meet the assembly requirements. At the same time, it is determined whether the contact between the layers is reliable by testing the conduction state between the conductive members 210 and the test pads 320 of the circuit board step by step, so as to avoid poor contact caused by visual alignment and ensure accurate and reliable alignment from the electrical performance.

In some embodiments, the wafer micro bump array 110 is a 4×4 rectangular array, a 6×6 rectangular array or an 8×8 rectangular array, which can be flexibly designed by those skilled in the art according to the actual situation.

In some embodiments, the wafer test pads 120 and the first alignment pad 130 are all distributed around the wafer micro bump array 110.

In some embodiments, the wafer micro bump array 110 and one side of the first alignment pad 130 near the dielectric layer 200 are all gold plated. Among them, the wafer test pad 120 can conduct electricity for electrical conduction tests. Because of the bright color of gold, it is easy to find it under the microscope or naked eye, and the first alignment pad 130 are convenient to align. Moreover, gold plating can resist oxidation and improve the service life of each layer of the system on wafer. The dielectric layer 200 is the same as the circuit board layer 300, which will not be described here.

Figure 2:
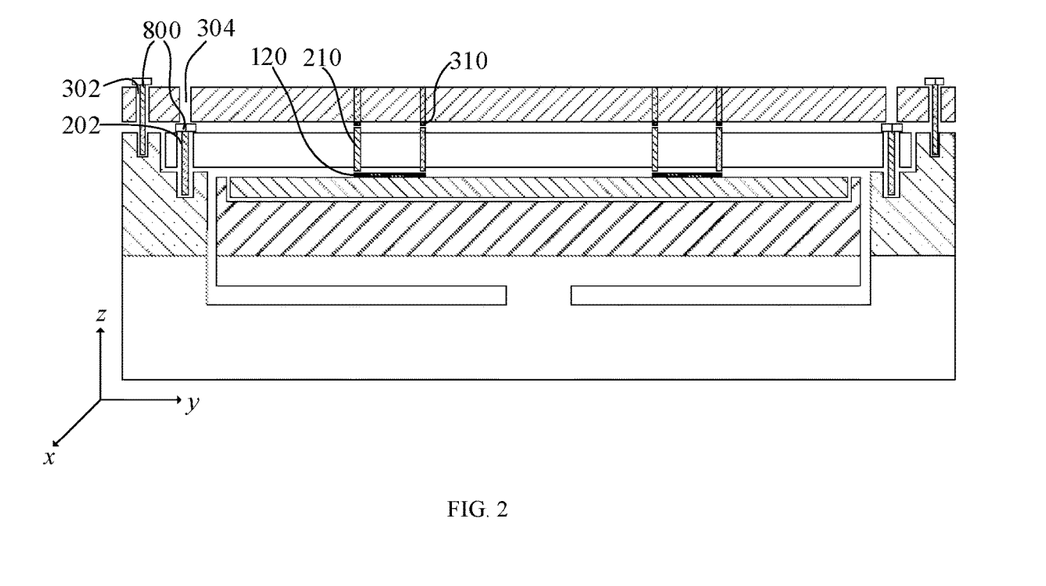
FIG. 2 is another schematic sectional view of the system on wafer assembly structure provided by the present disclosure.
Figure 3:
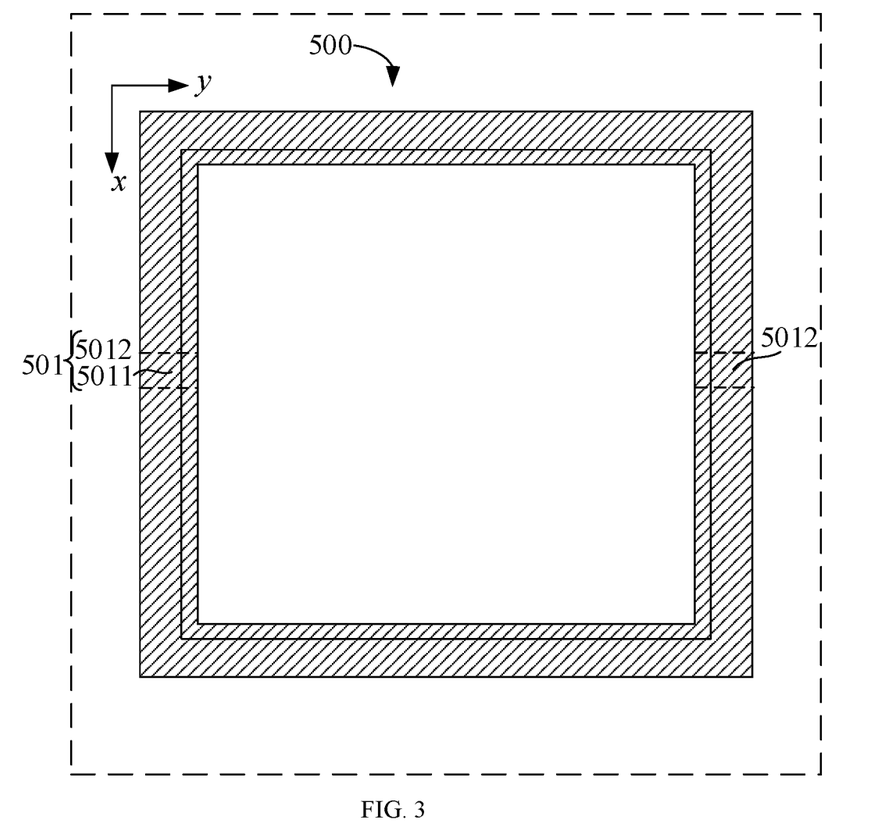
FIG. 3 is a top view of a second assembly provided by the present disclosure.

In some embodiments, as shown in FIG. 2, the conductive member 210 is an elastic pin, which can conduct a circuit. The contact 220 is further an elastic needle, which can generate contact force between the layers through the compression between the layers, so as to make the layers adhere tightly and avoid poor contact.

In some embodiments, the first alignment hole 201 and the second alignment hole 301 are circular, elliptical, rectangular or polygonal.

In some embodiments, as shown in FIG. 2, the distances between the conductive members 210 corresponding to the wafer test pads 120 are equal to the distances between the wafer test pads 120 corresponding to the conductive members and distances between the circuit board conduction pads 310 corresponding to the conductive members, respectively.

In this embodiment, the distance between the conductive member 210 and the corresponding wafer test pad 120 is equal, and it is possible to detect whether the alignment is accurate through the electrical conduction test. If they are misaligned, the conductive members 210 cannot communicate with each other successfully; and if the position is accurate, the conductive members 210 can communicate with each other smoothly. Therefore, the conduction state between the conductive members 210 can be tested by the circuit testing device to determine whether the contact between the layers is reliable. The conductive member 210 is the same as the corresponding circuit board test pad 320, and will not be described in detail.

In some embodiments, the second assembly 500 is detachably connected with the dielectric layer 200 and the circuit board layer 300 through the adjustable fasteners 800. As shown in FIG. 2, the dielectric layer 200 further includes a first mounting hole 202 matched with the adjustable fastener 800; the circuit board layer 300 further includes a second mounting hole 302 which is matched with the adjustable fastener 800.

In an illustrative embodiment, the adjustable fastener 800 includes a screw, a bolt or a stud. Those skilled in the art can set it flexibly according to the actual situation.

In some embodiments, as shown in FIG. 2, the circuit board layer 300 further includes a third alignment hole 303 for aligning with the first alignment hole 201 of the dielectric layer 200 to make the alignment more accurate.

In some embodiments, as shown in FIG. 2, the circuit board layer 300 further includes a third mounting hole 304 for aligning with the first mounting hole 202 of the dielectric layer 200 and accommodating at least part of the adjustable fasteners 800 to make the contact between the dielectric layer 200 and the circuit board layer 300 more flat and fit.

It should be noted that FIG. 2 is a cross-sectional view of the system on wafer assembly structure provided by this embodiment along the dashed line BB' as shown in FIG. 9.

In some embodiments, the system on wafer assembly structure further includes a base 700. As shown in FIG. 1, the center region of the base 700 is connected with one side of the movable assembly 600 far away from the wafer layer 100, and the edge region of the base 700 is detachably connected with the second assembly 500. The base 700 is configured for bearing the first assembly 400, the second assembly 500, the wafer layer 100, the dielectric layer 200 and the circuit board layer 300. After the alignment is completed, the base 700 can be disassembled, which can realize recycling, save the assembly cost and reduce the volume and weight of the whole portion system.

Based on the same inventive concept, the present disclosure further provides an assembly method of a system on wafer assembly structure, which includes the following steps:

S100: providing assemblies, which comprise a first assembly 400 and a second assembly 500, the second assembly 500 is at least partially arranged around the first assembly 400, and a latch portion 420 of the first assembly 400 is located in a hole portion 501 of the second assembly 500.

S200: fixing a wafer layer 100 on the first assembly 400.

S300: fixing a dielectric layer 200 on one side of the wafer layer 100 far from the first assembly 400.

S400: moving the first assembly 400, and simultaneously driving the wafer layer 100 to move to a position corresponding to the dielectric layer 200 for preliminary alignment connection.

S500: performing the electrical conduction test on the alignment state between the dielectric layer 200 and the wafer layer 100, and fixing a relative position between the wafer layer 100 and the dielectric layer 200 after the electrical conduction test.

S600: placing a circuit board layer 300 on one side of the dielectric layer 200 far away from the wafer layer 100, and moving the circuit board layer 300 to a position corresponding to the dielectric layer 200 for preliminary alignment connection.

S700: performing the electrical conduction test on the alignment state between the circuit board layer 300 and the dielectric layer 200, and fixing a relative position between the circuit board layer 300 and the dielectric layer 200 after the electrical conduction test.

S800: fixing a relative position between the first assembly 400 and the second assembly 500.

In this embodiment, the first assembly 400 and the second assembly 500 cooperate with each other by means of the system on wafer assembly structure, and the position of the dielectric layer 200 relative to the second assembly 500 is fixed. By adjusting the positions of the wafer layer 100 and the circuit board layer 300 relative to the dielectric layer 200, the initial alignment is achieved. Further, by means of the circuit testing device, the electrical conduction test between the layers is carried out to confirm whether the alignment is accurate, so that the occurrence of poor contact, dislocation of pads and interlayer can be avoided.

In some embodiments, the step S400 includes:

S410: establishing a detachable connection between the movable assembly 600 and one side of the first assembly 400 away from the wafer layer 100.

S420: controlling the movable assembly 600 to move in any direction within a preset range, and driving the wafer layer 100 to move the first alignment pad 130 on the wafer layer 100 to a position corresponding to the first alignment hole 201 on the dielectric layer 200 for preliminary alignment connection.

In this embodiment, the movable assembly 600 is configured to replace the traditional manual movement mode, the mechanical movable assembly is configured to fix the first assembly 400, and the orientation of the first assembly 400 is adjusted to drive the wafer layer 100 to move, thus realizing the alignment connection between the wafer layer 100 and the dielectric layer 200. Efficient and accurate alignment can be further realized to avoid individual error and manual error of manual operation.

In the above embodiment, step S900 is further included after step S800: dismounting the movable assembly 600. After the alignment connection between the wafer layer 100 and the dielectric layer 200 is realized by the movable assembly 600, the movable assembly 600 can be disassembled to be recycled, thereby saving costs.

In some embodiments, step S800 specifically includes: filling the hole portion 501 with an injection molding material to fixedly connect the first assembly 400 and the second assembly 500. In this embodiment, the relative position between the first assembly 400 and the second assembly 500 is fixed by injection molding material, so that the two assemblies which can realize relative movement can be integrated, and the alignment accuracy can be prevented from changing due to external forces such as vibration, and the alignment accuracy can be improved.

In some embodiments, the injection molding material is solid glue or tin.

In some embodiments, step S500 includes:

S510: testing the conduction state between the conductive members 210 on the dielectric layer 200 by a circuit testing device.

S520: when the conduction state is conducted, keeping the orientation of the first assembly 400 unchanged and fixing the relative position between the wafer layer 100 and the dielectric layer 200; when the conduction state is not conducted, moving the first assembly 400 again for preliminary alignment until the conduction state is conducted.

In this embodiment, the electrical conduction test can further improve the alignment accuracy and avoid poor contact.

In some embodiments, step S700 includes:

S710: testing the conduction state between the test pads 320 of the circuit board by the circuit testing device.

S720: when the conduction state is conducted, keeping the orientation of the circuit board layer 300 unchanged and fixing the relative position between the circuit board layer 300 and the dielectric layer 200; when the conduction state is not conducted, moving the circuit board layer 300 again for preliminary alignment until the conduction state is conducted.

In order to facilitate understanding, the present disclosure provides the following specific examples to further illustrate the assembly method of the system on wafer assembly structure provided by the present disclosure.

In Step S101: assemblies, which include a first assembly 400 and a second assembly 500, are provided. In an embodiment, the first assembly 400 and the second assembly 500 shown in FIGS. 3, 4, 5 and 6 are manufactured by mechanical processing technology, and the materials of the first assembly 400 and the second assembly 500 are both red copper. One side of the first assembly 400 is provided with a recessed region for accommodating the wafer, with a diameter of 200 mm, a depth of 0.78 mm and a machining error of ±0.05 mm, and the recessed region of the wafer further includes a protrusion complementary to the wafer notch 101. The size of the bearing portion 410 of the first assembly 400 is 210 mm (L)×210 mm (W)×20 mm (H), the length of the latch portion 420 is 15 mm, and one side section is square, with a size of 4 mm×4 mm. The second assembly 500 has a symmetrical structure, with an external dimension of 270 mm (L)×270 mm (W)×23 mm (H), an internal hollowing dimension of 214 mm (L)×214 mm (W)×23 mm (H), and the hole portion 501 is square, with a dimension of 6 mm×6 mm.

Step S201: the wafer layer 100 is fixed on the first assembly 400. In an embodiment, the wafer layer 100 is placed in the recessed region of the first assembly 400 and the wafer notch 101 is fitted with the protrusion. As shown in FIG. 7, the wafer layer 100 is an 8-inch wafer, and includes four groups of first pair of pads 130 with different sizes, each group includes three pads, specifically including a pad with a diameter of 1 mm in the middle and two pads with a diameter of 0.3 mm on two sides, the spacing between each pad is 5 mm, and each pad is made by micro-nano processing technology. The wafer layer 100 further includes a 6×6 rectangular wafer micro bump array 110, and the diameter of each wafer micro bump in the array is 0.3 mm. The wafer layer 100 further includes four groups of wafer test pads 120 (pads), each group of wafer test pads 120 (pads) consists of two adjacent circular pads with a diameter of 0.3 mm and an interconnection line with a diameter of 0.2 mm. All pads are plated with 2 um gold, the same below.

Step S301: the dielectric layer 200 is fixed on one side of the wafer layer 100 far away from the first assembly 400. In an embodiment, the dielectric layer 200 is fixed to the second assembly 500 through the first mounting hole 202 with the adjustable fastener 800. As shown in FIG. 8, the dielectric layer 200 is an organic low-loss dielectric plate of 230 mm×230 mm×3 mm, and includes a first alignment hole 201 corresponding to the first alignment pad 130 on the wafer layer 100, a contact 220 corresponding to the wafer micro bump array 110, and two conductive members 210 (elastic pins) penetrating the surface of the dielectric layer 200 corresponding to the wafer test pads 120. In addition, the dielectric layer 200 is further provided with four groups of second pair of pads 230, each group contains a pad with a diameter of 1 mm in the middle and two pads with a diameter of 0.3 mm on two sides, and the spacing between each pad is 5 mm. In addition, there are four first mounting holes 202 around the dielectric layer 200 with an aperture of 3.2 mm.

Step S401: the first assembly 400 is moved to drive the wafer layer 100 to a position corresponding to the dielectric layer 200 for preliminary alignment connection. In this embodiment, the movable assembly 600 is a vacuum adsorption structure, the diameter of the air duct is 4 mm, and the vacuum adsorption structure is further provided with a three-dimensional knob, the accuracy of the knob in the X, Y and Z directions is 25 um, and the stroke of the control sucker is 5 mm. The air pump 620 is connected to the air inlet and vacuumized, so that the movable assembly 600 and the first assembly can be connected by adsorption. The movable assembly 600 adjusts the moving distance of the first assembly 400 in the X, Y and Z directions, and drives the wafer layer 100 to move the first alignment pad 130 on the wafer layer 100 to a position corresponding to the first alignment hole 201 on the dielectric layer 200 for preliminary alignment connection. As shown in FIG. 1, the system on wafer assembly structure further includes a base 700. The external dimension of the base 700 is 270 mm (L)×270 mm (W)×35 mm (H), and the thickness of the base 700 near the movable assembly 600 is 10 mm. The base 700 is configured to bear the first assembly 400 and the second assembly 500.

Step S501: the electrical conduction test is performed for the alignment state between the dielectric layer 200 and the wafer layer 100, and the relative position between the wafer layer 100 and the dielectric layer 200 is fixed after the electrical conduction test. In an embodiment, a universal ammeter is configured to test the electrical conduction state between adjacent conductive members 210 (elastic pins), and when the conduction state is conducted, the alignment is accurate; when the conduction state is not conducted, repeat the above step S401 until the conduction state is conducted.

Step S601: the circuit board layer 300 is placed on one side of the dielectric layer 200 far away from the wafer layer 100, and the circuit board layer 300 is moved to a position corresponding to the dielectric layer 200 for preliminary alignment connection. In an embodiment, the second alignment hole 301 on the circuit board layer 300 is moved to a position corresponding to the second alignment pad 230 on the dielectric layer 200, and then the specific position of the circuit board layer 300 is generally adjusted by using the adjustable fastener 800 while observing the alignment of the second alignment hole 301. When the complete second alignment pad 230 can be seen from the second alignment hole 301, the adjustable fastener 800 is slowly tightened. As shown in FIG. 9, the material of the circuit board layer 300 is FR-4, with a size is 270 mm (L)×270 mm (W)×3 mm (H), including a circuit board micro bump array 330 corresponding to the contact 220 on the dielectric layer 200, a circuit board conduction pad 310 corresponding to the conductive member 210 (elastic pin) on the dielectric layer 200, a second alignment hole 301 corresponding to the second alignment pad 230 on the dielectric layer 200, a third alignment hole 303 corresponding to the first alignment hole 201 on the dielectric layer 200 and a third mounting hole 304 corresponding to the first mounting hole 202 on the dielectric layer 200. In addition, the circuit board layer 300 has four second mounting holes 302 around it, each with a diameter of 4.2 mm. At the same time, on one side of the circuit board layer 300 far away from the dielectric layer 200, there is a circuit board test pad 320, with a size of 1 mm×1 mm. The circuit board test pads 320 are interconnected with the circuit board conductive micro bumps arranged on one side of the circuit board layer 300 close to the dielectric layer 200, with a total of eight.

Step S701: the electrical conduction test is performed on the alignment state between the circuit board layer 300 and the dielectric layer 200, and the relative position between the circuit board layer 300 and the dielectric layer 200 is fixed after the electrical conduction test. In an embodiment, a multimeter is configured to test the electrical conduction state between adjacent circuit board test pads 320, and if when the conduction state is conducted, it indicates that the alignment is accurate; when the conduction state is not conducted, the above step S601 is repeated until the conduction state is conducted.

Step S801: the relative position between the first assembly 400 and the second assembly 500 is fixed. In an embodiment, molten tin is poured into the hole portion 501 of the second assembly 500 to fix the relative position between the first assembly 400 and the second assembly 500. The air pump 620 is turned off and the base 700 is removed, that is, the assembly of the system is completed.

The above embodiments of the present disclosure can complement each other without conflict.

Those skilled in the art can understand that the steps, measures and solutions in various operations, methods and processes discussed in the present disclosure can be alternated, changed, combined or deleted. Further, other steps, measures and solutions in various operations, methods and processes already discussed in the present disclosure can further be alternated, changed, rearranged, decomposed, combined or deleted. Further, steps, measures and solutions in related technologies that are different from those in various operations, methods and flows disclosed in the present disclosure can further be alternated, changed, rearranged, decomposed, combined or deleted.

In the description of the present disclosure, it should be understood that the orientations or positions indicated by the terms "center", "up", "below", "front", "back", "left", "right", "vertical", "horizontal", "top", "bottom", "inside" and "outside" are orientations or positional relationship based on the attached drawings, which are only for the convenience of describing the application and simplifying the description, and do not indicate or imply that the device or element referred to must have a specific orientation, be constructed and operated in a specific orientation, and thus cannot be understood as a limitation of the application.

The terms "first" and "second" are only used for descriptive purposes, and cannot be understood as indicating or implying relative importance or implicitly indicating the number of indicated technical features. Therefore, the features defined as "first" and "second" may include one or more of these features explicitly or implicitly. In the description of the present disclosure, unless otherwise specified, "a plurality of" means two or more.

In the description of the present disclosure, it should be noted that unless otherwise specified and limited, the terms "installation", "linking" and "connection" should be broadly understood, for example, they can be fixed connections, detachable connections or integrated connections; they may be direct connections, or indirectly connections through an intermediate medium, and may be connections inside two elements. For those skilled in the art, the specific meanings of the above terms in the present disclosure can be understood in specific circumstances.

In the description of this specification, specific features, structures, materials or characteristics can be combined in any one or more embodiments or examples in a suitable way. The above is only a part of the implementation of the present disclosure. It should be pointed out that for those skilled in the art, several improvements and embellishments can be made without departing from the principles of the present disclosure, and these improvements and embellishments should further be regarded as the protection scope of the present disclosure.

What is claimed is:

1. A system on wafer assembly structure, comprising:
a wafer layer, a dielectric layer and a circuit board layer sequentially stacked, each arranged with a bonding region, a testing region and an alignment region, respectively;
wherein a wafer micro bump array, at least two interconnected wafer test pads and at least one first alignment pad are formed on a side of the wafer layer close to the dielectric layer, and a bonding region, a testing region and an alignment region are formed in regions where the wafer micro bump array, the interconnected wafer test pads and the first alignment pad are located, respectively; the dielectric layer is formed with at least one first alignment hole, corresponding to the first alignment pad, configured for preliminary alignment between the wafer layer and the dielectric layer, and at least two conductive members penetrating through a surface of the dielectric layer, corresponding to the interconnected wafer test pads, respectively, configured for an electrical conduction test after the preliminary alignment between the wafer layer and the dielectric layer to test an alignment state; the dielectric layer further comprises a plurality of contacts penetrating through the surface of the dielectric layer, the wafer micro bump array is arranged opposite to one side of the contacts close to the wafer layer, and at least one second alignment pad is formed on the other side of the dielectric layer far away from the wafer layer; at least one second alignment hole is formed on the circuit board layer, and the second alignment hole corresponds to the second alignment pad and is configured for preliminary alignment between the dielectric layer and the circuit board layer; the circuit board layer is formed with at least two pairs of circuit board conduction pads and circuit board test pads electrically connected with each other, arranged on one side of the circuit board layer close to the dielectric layer and the other side of the circuit board layer far away from the dielectric layer, respectively; the circuit board test pads corresponds to the conductive members, respectively, and are configured for the electrical conduction test after the preliminary alignment between the dielectric layer and the circuit board layer to test the alignment state; and a circuit board micro bump array is formed on the side of the circuit board layer close to the dielectric layer and arranged opposite to the contacts;
a first assembly arranged on one side of the wafer layer far away from the dielectric layer, wherein the first assembly comprises a bearing portion detachably connected with the wafer layer and at least one latch portion connected with each other; and
a second assembly at least partially arranged around the first assembly, wherein the second assembly comprises a hole portion for accommodating the latch portion, an inner diameter of the hole portion is larger than an outer diameter of the latch portion, there is a gap between one side of the second assembly close to the bearing portion and the bearing portion, and the second assembly is detachably connected with the dielectric layer and the circuit board layer, respectively.

2. The system on wafer assembly structure according to claim 1, further comprising:
a movable assembly arranged on one side of the first assembly far away from the wafer layer, and detachably connected with the first assembly for adjusting an orientation of the wafer layer during alignment.

3. The system on wafer assembly structure according to claim 2, wherein the movable assembly comprises a vacuum adsorption structure; wherein a gas channel is arranged in the vacuum adsorption structure, and a port at one end of the gas channel faces one side of the first assembly far away from the wafer layer for contacting with the first assembly; and the other end of the gas channel is connected with an air pump, and the air pump is configured to control an air pressure in the gas channel so as to allow the movable assembly and the first assembly be connected or disconnected by adsorption with each other.

4. The system on wafer assembly structure according to claim 2, wherein the movable assembly comprises a magnetic attraction structure; the first assembly is made of a magnetic material; and a magnetic attraction force of the magnetic attraction structure is adjustable to allow the movable assembly and the first assembly be connected or disconnected by adsorption with each other.

5. The system on wafer assembly structure according to claim 1, wherein the latch portion comprises a first latch portion and a second latch portion, and the hole portion comprises a first hole portion matched with the first latch portion and a second hole portion matched with the second latch portion; and
wherein the first latch portion and the second latch portion are arranged at opposite or adjacent sides of the bearing portion, respectively.

6. The system on wafer assembly structure according to claim 1, wherein distances between the conductive members corresponding to the wafer test pads are equal to distances between the wafer test pads corresponding to the conductive members and distances between the circuit board conduction pads corresponding to the conductive members, respectively.

* * * * *